(12) United States Patent
Lin et al.

(10) Patent No.: US 12,389,606 B2
(45) Date of Patent: Aug. 12, 2025

(54) MRAM STRUCTURE AND FABRICATING METHOD OF THE SAME

(71) Applicant: UNITED MICROELECTRONICS CORP., Hsin-Chu (TW)

(72) Inventors: Da-Jun Lin, Kaohsiung (TW); Fu-Yu Tsai, Tainan (TW); Bin-Siang Tsai, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 142 days.

(21) Appl. No.: 18/508,204

(22) Filed: Nov. 13, 2023

(65) Prior Publication Data

US 2025/0120092 A1 Apr. 10, 2025

(30) Foreign Application Priority Data

Oct. 9, 2023 (CN) .......................... 202311298899.5

(51) Int. Cl.
| | |
|---|---|
| *G11C 11/15* | (2006.01) |
| *G11C 11/16* | (2006.01) |
| *H10B 61/00* | (2023.01) |
| *H10N 50/01* | (2023.01) |
| *H10N 50/20* | (2023.01) |
| *H10N 50/85* | (2023.01) |

(52) U.S. Cl.
CPC ............ *H10B 61/00* (2023.02); *G11C 11/161* (2013.01); *G11C 11/1673* (2013.01); *G11C 11/1675* (2013.01); *H10N 50/01* (2023.02); *H10N 50/20* (2023.02); *H10N 50/85* (2023.02)

(58) Field of Classification Search
CPC ... H10B 61/00; G11C 11/161; G11C 11/1673; G11C 11/1675; G11C 11/1659; G11C 11/18; H10N 50/01; H10N 50/20; H10N 50/85; H10N 50/10
See application file for complete search history.

(56) References Cited

U.S. PATENT DOCUMENTS

| | | | |
|---|---|---|---|
| 9,837,602 B2 | 12/2017 | Braganca | |
| 10,490,601 B2 | 11/2019 | Braganca | |
| 11,165,012 B2 | 11/2021 | Ying | |
| 2007/0187785 A1* | 8/2007 | Hung ..................... | H10N 50/01 257/E43.006 |
| 2008/0023728 A1* | 1/2008 | Jang ..................... | H10B 10/125 257/E27.111 |
| 2021/0184105 A1* | 6/2021 | Sasaki ..................... | H10N 52/80 |
| 2023/0282260 A1* | 9/2023 | Chen ..................... | H01F 41/308 365/158 |

\* cited by examiner

*Primary Examiner* — Hien N Nguyen
(74) *Attorney, Agent, or Firm* — Winston Hsu (57) ABSTRACT

An MRAM structure includes a first memory unit and a second memory unit. A conductive line is disposed between the first memory unit and the second memory unit. An SOT metal conductive line contacts and electrically connects an end of the first memory unit, an end of the conductive line and an end of the second memory unit. A first switch element is electrically connected to an end of the SOT metal conductive line, and a second switch element is electrically connected to the other end of the SOT metal conductive line. A third switch element is electrically connected to the other end of the first memory unit. A fourth switch element is electrically connected to the other end of the conductive line. A fifth switch element is electrically connected to the other end of the second memory unit.

12 Claims, 10 Drawing Sheets

MRAM STRUCTURE AND FABRICATING METHOD OF THE SAME

BACKGROUND OF THE INVENTION

1. Field of the Invention

The present invention relates to a magnetoresistive random access memory (MRAM) structure, in particular to a structure that utilizes a spin orbit torque (SOT) conductive metal line to electrically connect numerous MRAM units at the same time.

2. Description of the Prior Art

MRAM provides performance comparable to volatile static random access memory, and has low power consumption and high density comparable to volatile dynamic random access memory. MRAM offers faster access times than flash memory, and longer data retention time.

MRAM is divided into two types. One type is spin transfer torque (STT) MRAM. STT MRAM is operated by using electric current to pass through the MTJ vertically. Another type of MRAM is spin orbit torque (SOT) MRAM, which uses current to change the spin direction of electrons in the free layer to change the direction of the magnetic moment, thereby to write or erase the SOT MRAM.

SUMMARY OF THE INVENTION

According to a preferred embodiment of the present invention, an MRAM structure includes a first memory unit, wherein the first memory unit includes a first magnetic tunnel junction (MTJ). A second memory unit, the second memory unit includes a second MTJ. A conductive line is disposed between the first memory unit and the second memory unit. A SOT metal conductive line is disposed on the first memory unit, the conductive line and the second memory unit, wherein the SOT metal conductive line contacts and electrically connects an end of the first memory unit, an end of the conductive line and an end of the second memory unit. A first switch element electrically connects to an end of the SOT metal conductive line. A second switch element electrically connects to the other end of the SOT metal conductive line. A third switch element electrically connects to the other end of the first memory unit. A fourth switch element electrically connects to the other end of the conductive line. A fifth switch element electrically connects to the other end of the second memory unit.

A fabricating method of an MRAM structure includes providing a bottom electrode material layer, a reference material layer, a barrier material layer, a free material layer and an SOT metal layer stacked from bottom to top. Next, the SOT metal layer, the free material layer, the barrier material layer, the reference material layer, and the bottom electrode material layer are etched to form a first memory unit and a second memory unit. Later, a conductive line is formed to be disposed between the first memory unit and the second memory unit. Subsequently, an SOT metal conductive line is formed to contact and electrically connect an end of the first memory unit, an end of the conductive line and an end of the second memory unit. After that, a first switch element is formed to electrically connect to an end of the SOT metal conductive line. Finally, a second switch element is formed to electrically connect to the other end of the SOT metal conductive line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a fabricating method of an MRAM structure according to a preferred embodiment of the present invention, wherein:

DETAILED DESCRIPTION

FIG. 1 to FIG. 5 depict a fabricating method of an MRAM structure according to a preferred embodiment of the present invention.

Figure 1:
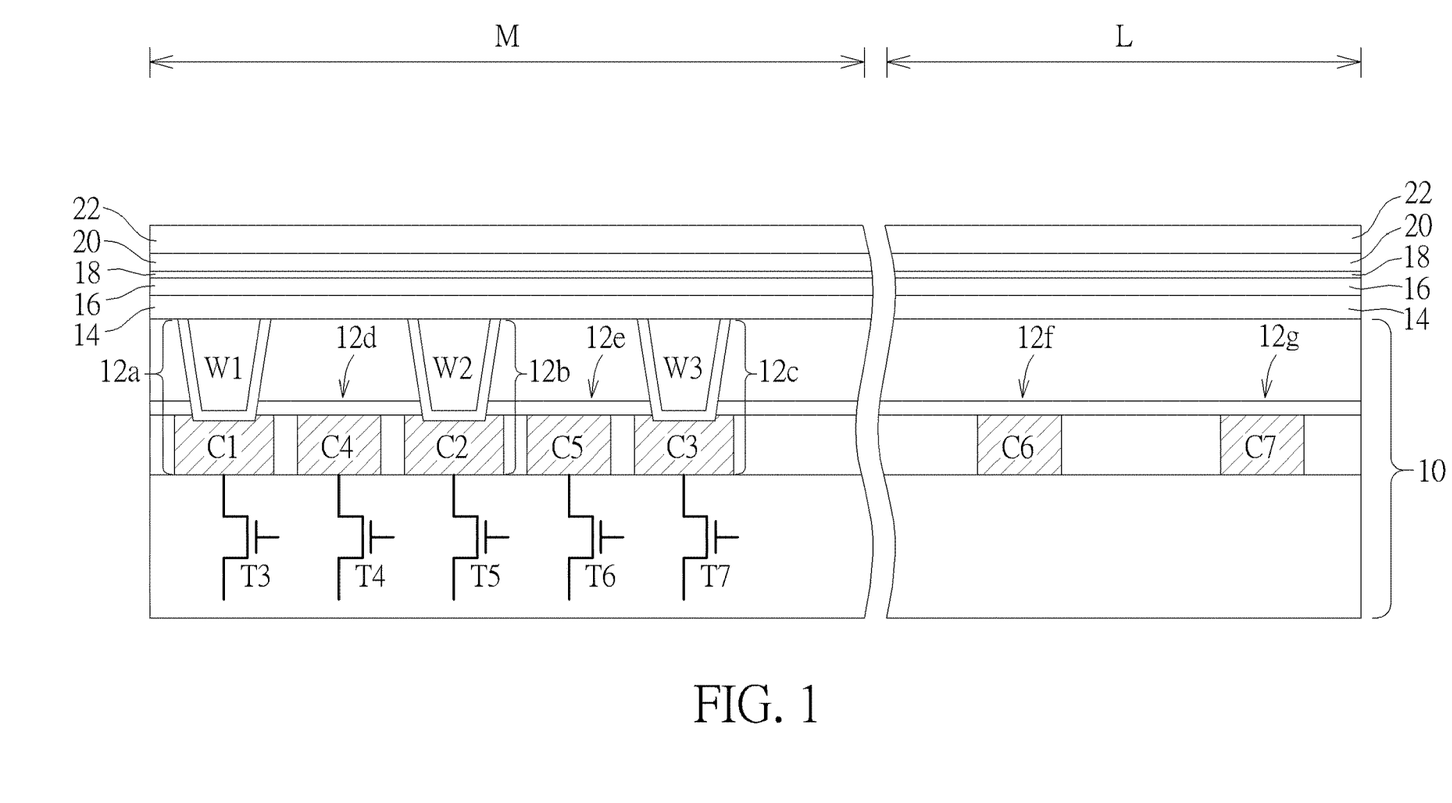
FIG. 1 depicts a material layer divided into a memory area and a logic circuit area.

As shown in FIG. 1, a material layer 10 is provided. The material layer 10 is divided into a memory area M and a logic circuit area L. The material layer 10 is formed by stacking a semiconductor substrate and a dielectric layer. The semiconductor substrate includes a silicon substrate, a germanium substrate, a gallium arsenide substrate, a silicon germanium substrate, an indium phosphide substrate, a gallium nitride substrate, a silicon carbide substrate or a silicon on insulator substrate, and the dielectric layer includes silicon oxide, silicon nitride or silicon oxynitride. A third switch element T3, a fourth switch element T4, a fifth switch element T5, a sixth switch element T6 and a seventh switch element T7 are disposed in the memory area M of the material layer 10. One terminal of each of the third switch element T3, the fifth switch element T5 and the seventh switch element T7 respectively physically contacts and electrically connects to metal interconnections 12a/12b/12c. One terminal of each of the fourth switch element T4 and the sixth switch element T6 respectively physically contacts and electrically connects to the metal interconnections 12d/12e. The metal interconnections 12a/12b/12c respectively include copper lines C1/C2/C3, and tungsten plugs W1/W2/W3 are on the copper lines C1/C2/C3. Metal interconnections 12d/12e respectively only include copper lines C4/C5. The metal interconnections 12f/12g are disposed in the logic circuit area L. Metal interconnections 12f/12g respectively only include copper lines C6/C7. Metal interconnections 12a/12b/12c12d/12e are disposed within the memory area M. The copper lines C1/C2/C3/C4/C5/C6/C7 are the same metal layer. The copper lines C1/C2/C3/C4/C5/C6/C7 are disposed under the tungsten plugs W1/W2/W3. The top surfaces of each of the tungsten plugs W1/W2/W3 is exposed through the material layer 10. Then, a bottom electrode material layer 14, a reference material layer 16, a barrier material layer 18, a free material layer 20 and a SOT metal layer 22 are stacked on the material layer 10 from bottom to top. The bottom electrode material layer 14 directly contacts the tungsten plugs W1/W2/W3. The SOT metal layer 20 includes ruthenium, tungsten, tantalum, iridium, platinum, hafnium, beryllium copper alloy, iridium copper alloy or gold tungsten alloy. The material of the SOT metal layer 22 has high spin-orbit coupling strength, and has high resistivity, for example, the resistivity is about 150 μΩ-cm to 250 μΩ-cm.

Figure 2:
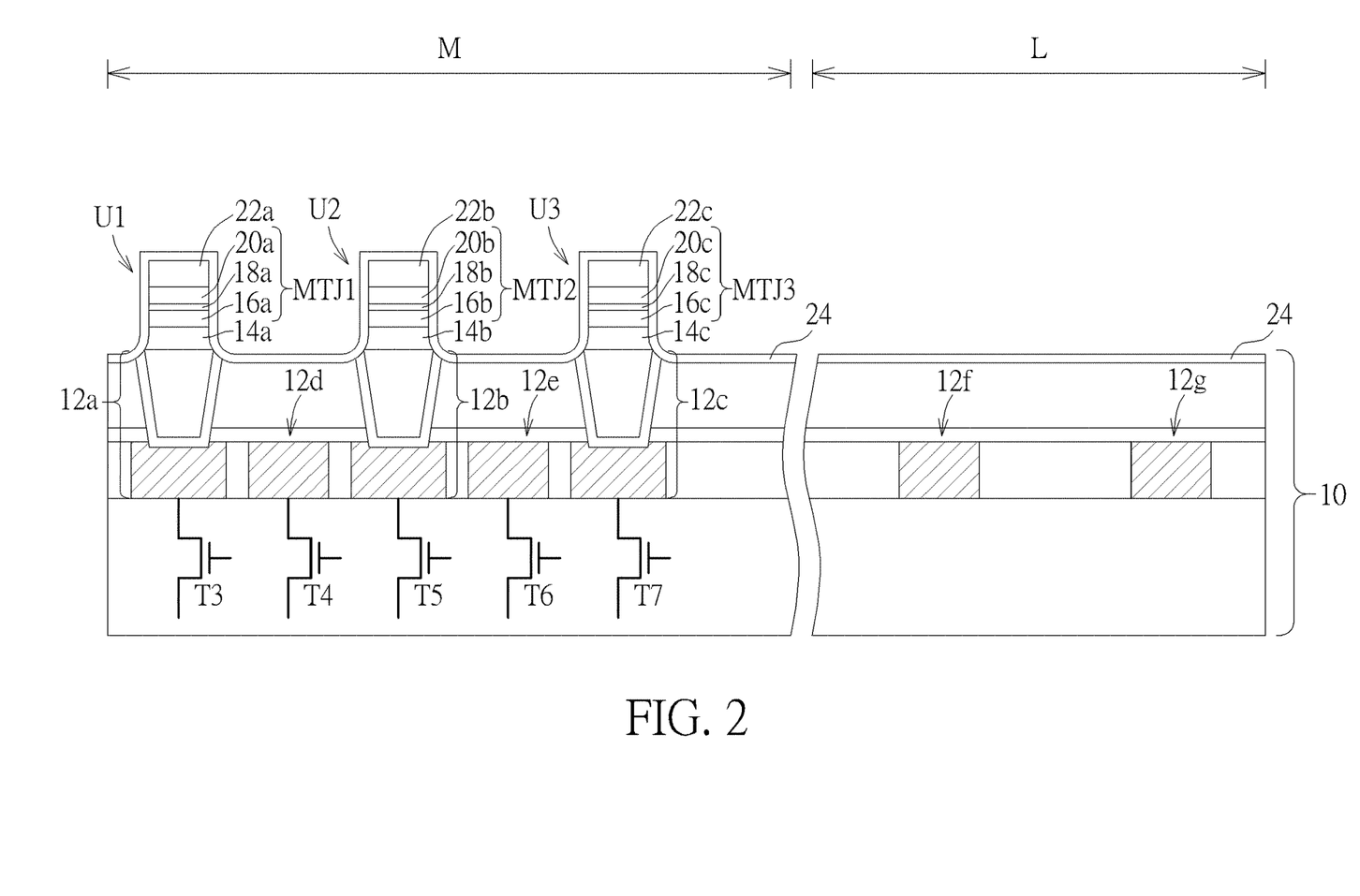
FIG. 2 is a fabricating stage in continuous of FIG. 1.

Please refer to FIG. 1 and FIG. 2. The SOT metal layer 22, the free material layer 20, the barrier material layer 18, the reference material layer 16 and the bottom electrode material layer 14 are etched to form several memory units on the memory area M of the material layer 10. For example, a first memory unit U1, a second memory unit U2 and a third memory unit U3 are formed. Meanwhile, the SOT metal layer 22, the free material layer 20, and the barrier material layer 18, the reference material layer 16 and the bottom electrode material layer 14 in the logic circuit area L are completely removed. Since the SOT metal layer 22 is above the free material layer 20, the free material layer 20 will not be damaged during the etching. The first memory unit U1 includes a first bottom electrode 14a, a first MTJ MTJ1 and a first SOT metal layer 22a stacked from bottom to top. The second memory unit U2 includes a second bottom electrode 14b, a second MTJ MTJ2 and a second SOT metal layer 22b stacked from bottom to top. The third memory unit U3 includes a third bottom electrode 14c, a third MTJ MTJ3 and a third SOT metal layer 22c stacked from bottom to top. Then, an etching stop layer 24 is formed conformally to cover the first memory unit U1, a second memory unit U2, a third memory unit U3 and the material layer 10.

Figure 3:
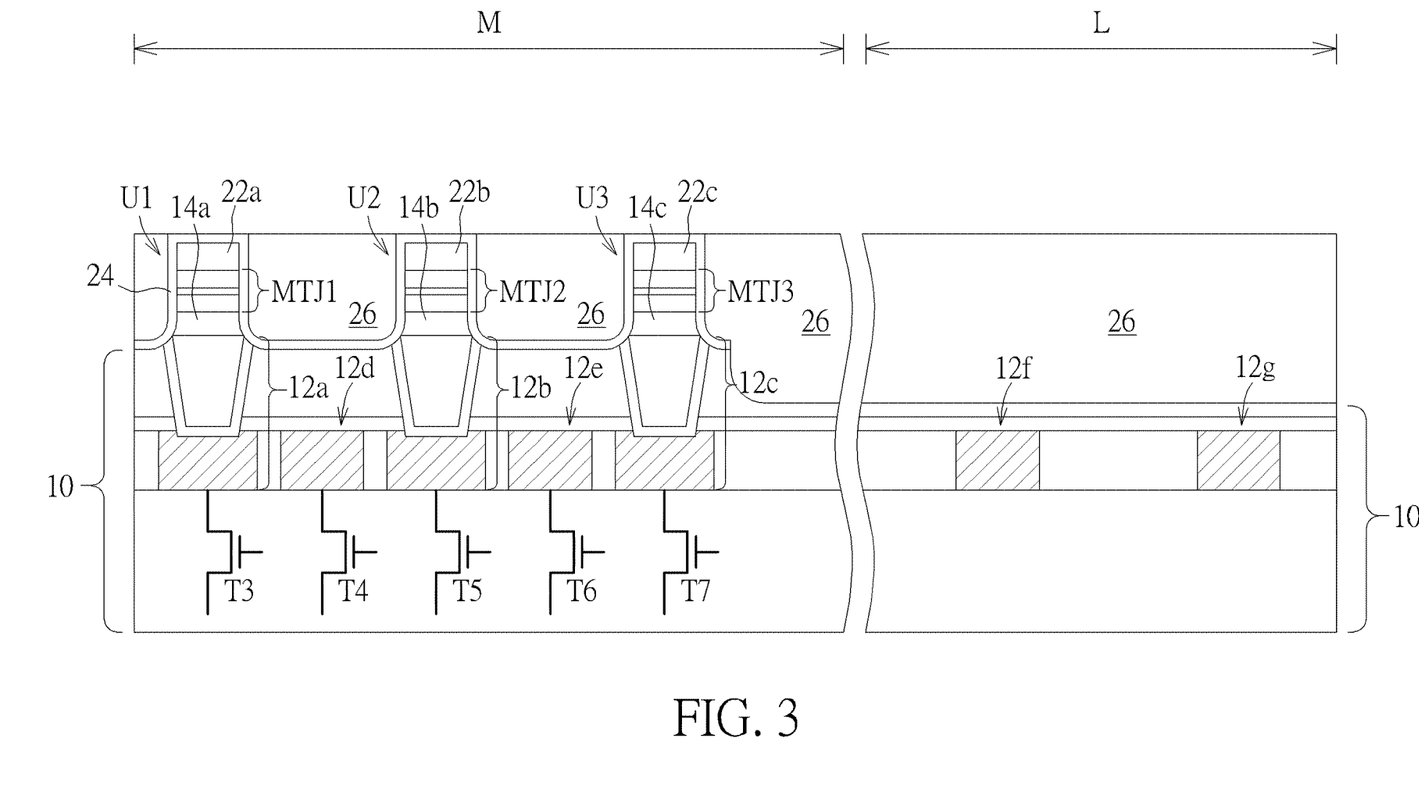
FIG. 3 is a fabricating stage in continuous of FIG. 2.

As shown in FIG. 3, a dielectric layer 26 is formed to cover the first memory unit U1, a second memory unit U2, a third memory unit U3 and the logic circuit area L. The dielectric layer 26 is planarized by using the etching stop layer 24 as a stop layer.

Figure 4:
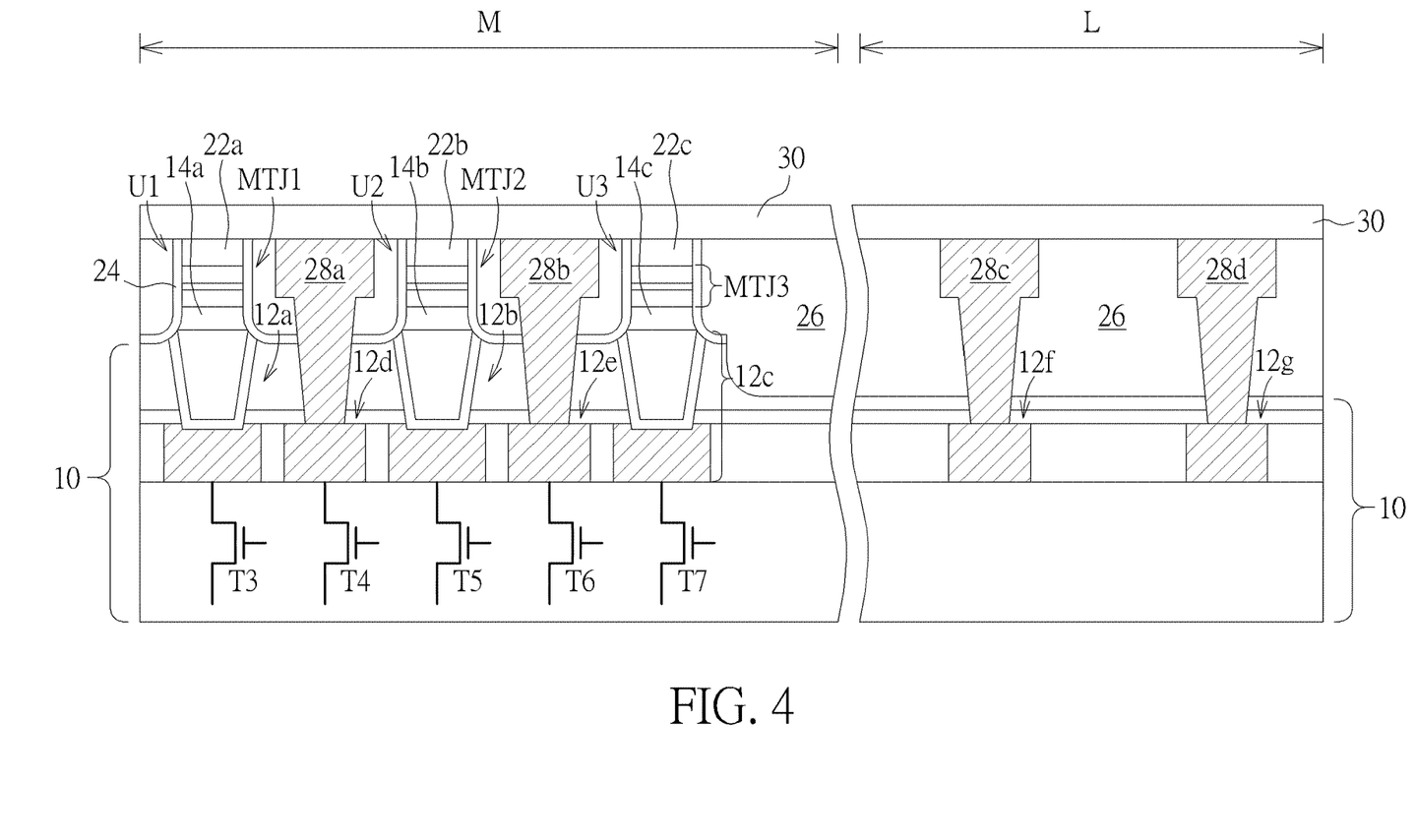
FIG. 4 is a fabricating stage in continuous of FIG. 3.

As shown in FIG. 4, four conductive lines 28a/28b/28c/28d are formed by using the same process. The conductive lines 28a/28b are respectively disposed between the first memory unit U1 and the second memory unit U2 and between the second memory unit U2 and the third memory unit U3. The conductive lines 28a/28b contact metal interconnections 12d/12e. The conductive lines 28c/28d are located in the logic circuit area L and contact the metal interconnections 12f/12g. The conductive lines 28a/28b/28c/28d are preferably dual damascene copper structures. After forming the conductive lines 28a/28b/28c/28d, the top surfaces of the conductive lines 28a/28b/28c/28d, an end of the first memory unit U1, an end of the second memory unit U2 and an end of the third memory unit U3 are exposed through the dielectric layer 26.

Please still to refer to FIG. 4. An SOT metal conductive line 30 is formed in the memory area M and the logic circuit area L. The SOT metal conductive line 30 contacts and electrically connects an end of the first memory unit U1, an end of the second memory unit U2, an end of the third memory unit U3 and an end of each of the conductive lines 28a/28b/28c/28d. The SOT metal conductive line 30 includes ruthenium, tungsten, tantalum, iridium, platinum, hafnium, beryllium copper alloy, iridium copper alloy or gold tungsten alloy.

Figure 5:
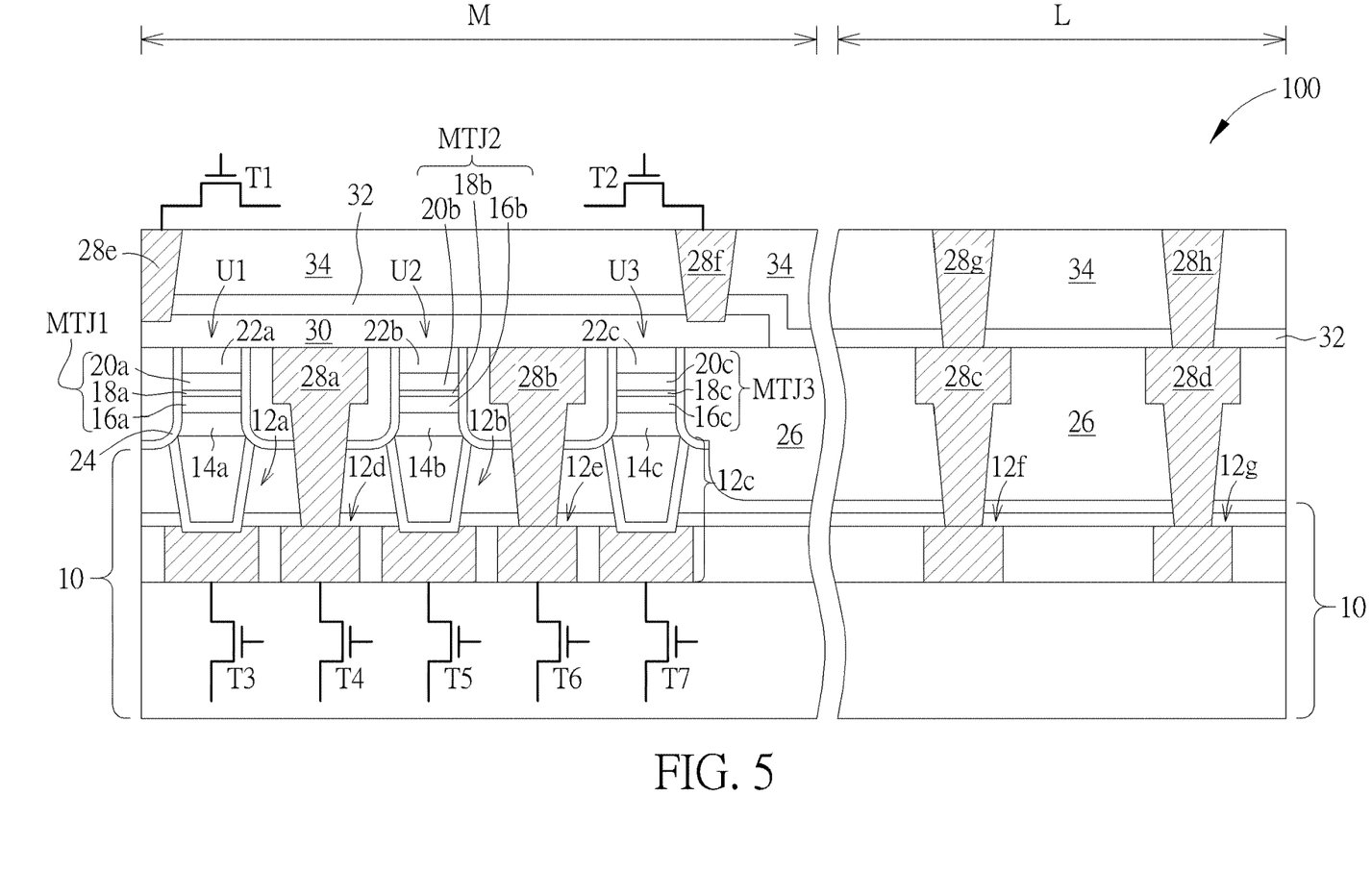
FIG. 5 is a fabricating stage in continuous of FIG. 4.

As shown in FIG. 5, the SOT metal conductive line 30 located in the logic circuit area L is removed. After that, a stop layer 32 is formed to cover the SOT metal conductive lines 30 and the dielectric layer 26. Next, a dielectric layer 34 is formed to cover the stop layer 32. Later, the conductive lines 28e/28f/28g/28h are formed by the same step to penetrate the dielectric coating 34 and the stop layer 32. The conductive lines 28e/28f are respectively in direct contact with the two ends of the SOT metal conductive lines 30. Conductive lines 28g/28h are respectively in direct contact with conductive lines 28c/28d. Next, a first switch element T1 and a second switch element T2 are formed. One terminal of the first switch element T1 contacts the conductive line 28e, and one terminal of the second switch element T2 contacts the conductive line 28f. Now, an MRAM structure 100 of the present invention is completed.

The total number of switch elements mentioned above is changed along with the number of memory units. The number of memory units can be adjusted according to different requirements. For example, when the number of memory units is M, the total number of switch elements is 2×M+1. M is a positive integer and not less than 1. Conductive lines 28a/28b/28c/28d/28e/28f/28g/28h are preferably copper, aluminum or tungsten. The first switch element T1, the second switch element T2, the third switch element T3, the fourth switch element T4, the fifth switch element T5, the sixth switch element T6 and the seventh switch element T7 are preferably MOS transistors.

As shown in FIG. 5, a MRAM structure 100 of the present invention includes a first memory unit U1, a second memory unit U2 and a third memory unit U3. The first memory unit U1 includes a first bottom electrode 14a, a first MTJ MTJ1 and a first SOT metal layer 22a stacked from bottom to top. The second memory unit U2 includes a second bottom electrode 14b, a second MTJ MTJ2 and a second SOT metal layer 22b stacked from bottom to top. The third memory unit U3 includes a third bottom electrode 14c, a third MTJ MTJ3 and a third SOT metal layer 22c stacked from bottom to top. A width of the first bottom electrode 14a, a width of the first MTJ MTJ1 and a width of the first SOT metal layer 22a are the same. A width of the second bottom electrode 14b, a width of the second MTJ MTJ2 and a width of the second SOT metal layer 22b are the same. A width of the third bottom electrode 14c, a width of the third MTJ MTJ3 and a width of the third SOT metal layer 22c are the same.

The conductive line 28a is disposed between the first memory unit U1 and the second memory unit U2. The conductive line 28b is disposed between the second memory unit U2 and the third memory unit U3. A SOT metal conductive line 30 is disposed on the first memory unit U1, the second memory unit U2, the third memory unit U3 and the conductive lines 28a/28b. The SOT metal conductive line 30 contacts and electrically connects an end of the first memory unit U1, an end of the second memory unit U2, an end of the third memory unit U3 and an end of the conductive line 28a and an end of the conductive line 28b. It is noteworthy that the SOT metal in the present invention is disposed at two positions. One position is within the first memory unit U1, the second memory unit U2, and the third memory unit U3 that serving as the first SOT metal layer 22a, the second SOT metal layer 22b and the third SOT metal layer 22c. The second position is the SOT metal conductive line 30. The reason for such a design is mentioned in the manufacturing process in FIG. 2 above. That is, when etching the free material layer 20, the barrier material layer 18, the reference material layer 16 and the bottom electrode material layer 14, in order to prevent the etchant from damaging the surface of the free material layer 20, the SOT material layer 22 is formed on the free material layer 20 as a protection.

Please refer to FIG. 5. A first switch element T1 is electrically connected to an end of the SOT metal conductive line 30 through the conductive line 28e. A second switch element T2 is electrically connected to the other end of the SOT metal conductive line 30 through the conductive line 28f. A third switch element T3 is electrically connected to one end of the first memory unit U1. A fourth switch element T4 is electrically connected to an end of the conductive line 28a. A fifth switch element T5 is electrically connected to an end of the second memory unit U2. A sixth switch element T6 is electrically connected to an end of the conductive line 28b. A seven switch element T7 is electrically connected to an end of the third memory unit U3.

The first MTJ MTJ1 includes a first reference layer 16a, a first barrier layer 18a and a first free layer 20a stacked from bottom to top. The second MTJ MTJ2 includes a second reference layer 16b, a second barrier layer 18b and a second free layer 20b stacked from bottom to top. The third MTJ MTJ3 includes a third reference layer 16c, a third barrier layer 18c and a third free layer 20c stacked from bottom to top. The first SOT metal layer 22a directly contacts the first free layer 20a, the second SOT metal layer 22b directly contacts the second free layer 20b, and the third SOT metal layer 22c directly contacts the third free layer 20c.

Each of the first SOT metal layer 22a, the second SOT metal layer 22b and the third SOT metal layer 22b respectively includes ruthenium, tungsten, tantalum, iridium, platinum, hafnium, beryllium copper alloy, iridium copper alloy or gold tungsten alloy. The SOT metal conductive line 30 includes ruthenium, tungsten, tantalum, iridium, platinum, hafnium, beryllium copper alloy, iridium copper alloy or gold tungsten alloy. The material of the SOT metal layers 22a/22b/22b and the SOT metal conductive line 30 has high spin orbit coupling strength, and has high resistivity, for example, the resistivity is about 150 μΩ-cm to 250 μΩ-cm.

The first bottom electrode 14a, the second bottom electrode 14b, and the third bottom electrode 14c respectively include conductive materials such as ruthenium, tantalum, nickel-chromium alloy or other conductive materials. The first reference layer 16a, the second reference layer 16b and the third reference layer 16c respectively include nickel, iron, cobalt, germanium, boron or manganese or alloys thereof. Each of the first barrier layer 18a, the second barrier layer 18b and the third barrier layer 18c includes magnesium oxide or hafnium oxide. The first free layer 20a, the second free layer 20b and the third free layer 20c respectively include nickel, iron, cobalt, germanium, boron or manganese or alloys thereof.

Figure 6:
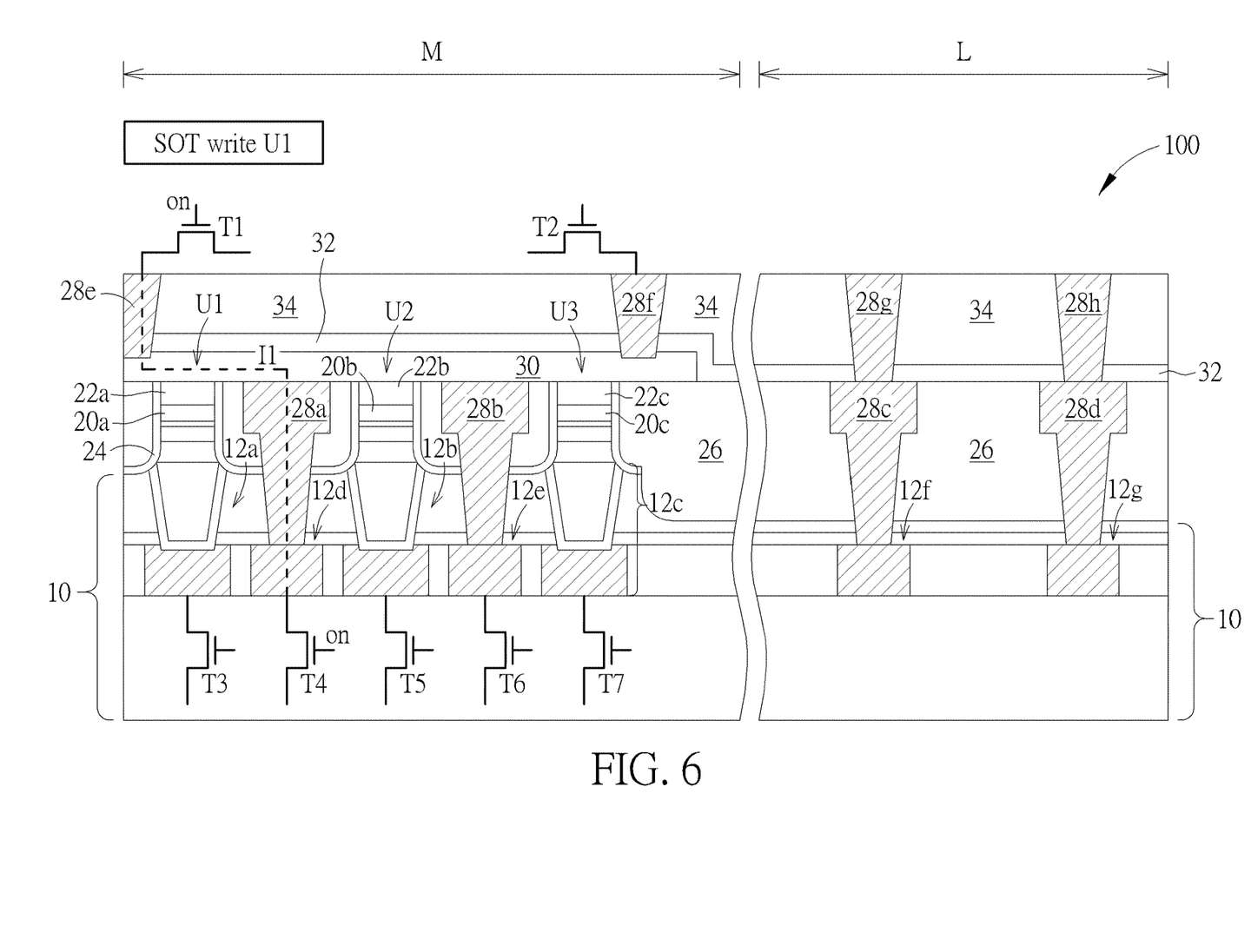
FIG. 6 depicts a write operation of an MRAM structure of the present invention.

FIG. 6 depicts a write operation of an MRAM structure of the present invention. Each of the memory unit in the MRAM structure of the present invention can be written separately or simultaneously.

As shown in FIG. 6, this embodiment demonstrates a write operation performed to write only the first memory unit U1. The writing method includes simultaneously turning on the first switch element T1 and the fourth switch element T4 to write to the first memory unit U1. Meanwhile, the second switch element T2, the third switch element T3, the fifth switch element T5, the sixth switch element T6 and the seventh switch element T7 are turned off. At this point, the current I1 flows between the first switch element T1, the conductive line 28e, the SOT metal conductive line 30, the conductive line 28a, the metal interconnection 12d and the fourth switch element T4. Since the current I1 passes through the first SOT metal layer 22a on the first free layer 20a, the direction of the magnetic moment of the first free layer 20a is changed. In this way, the write operation of the first memory unit U1 can be completed. Since the current I1 passes parallel to the magnetic moment direction of the first free layer 20a, this write operation is called an SOT write.

Figure 7:
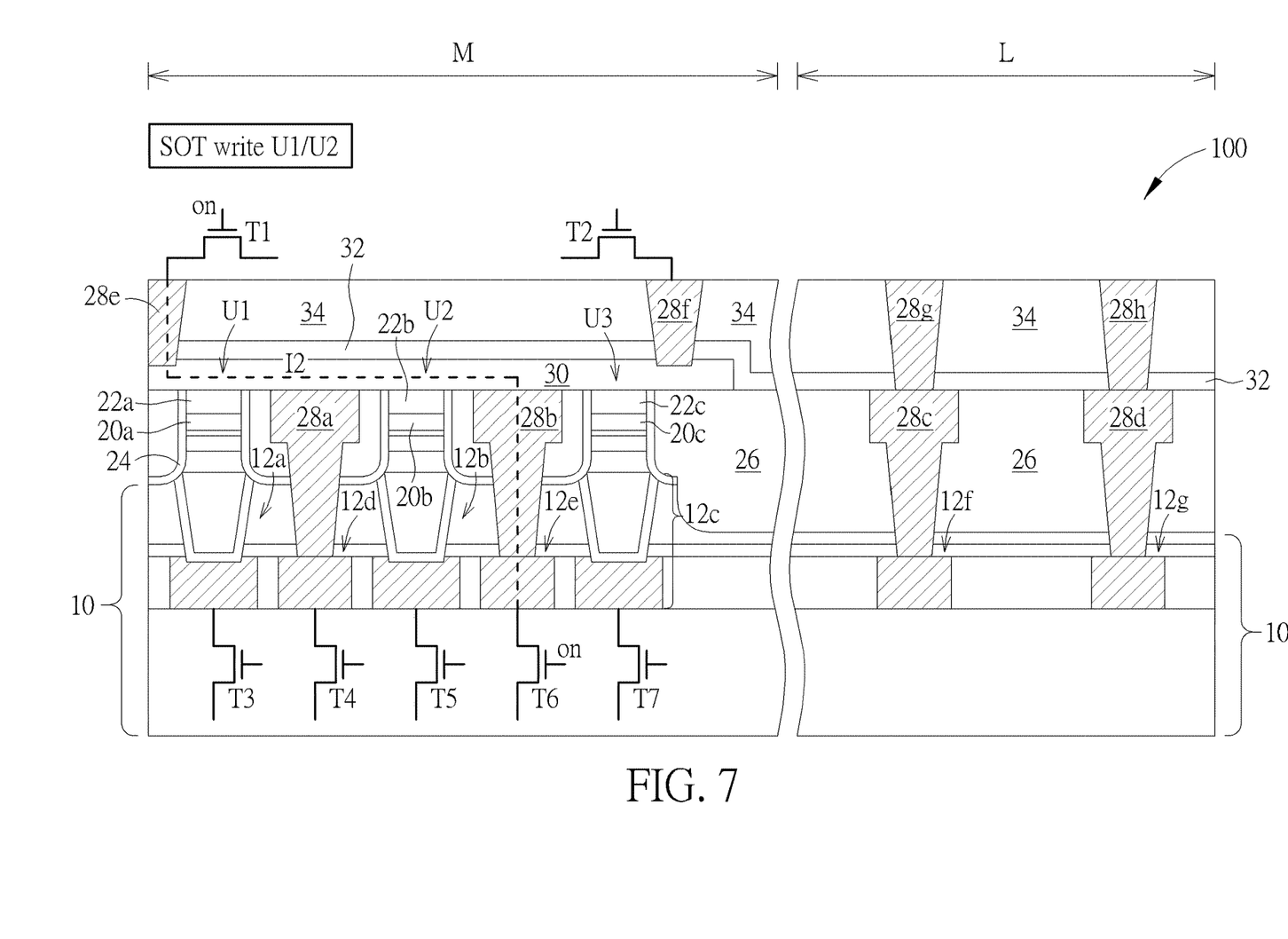
FIG. 7 depicts a write operation of an MRAM structure of the present invention.

FIG. 7 depicts a write operation of an MRAM structure of the present invention. As shown in FIG. 7, this embodiment demonstrates a write operation performed to write the first memory unit U1 and the second memory unit U2 simultaneously without writing the third memory unit U3. The writing method includes simultaneously turning on the first switch element T1 and the sixth switch element T6 to write to the first memory unit U1 and the second memory unit U2. Meanwhile, the second switch element T2, the third switch element T3, the fourth switch element T4, the fifth switch element T5 and the seventh switch element T7 are turned off. At this point, the current I2 flows between the first switch element T1, the conductive line 28e, the SOT metal conductive line 30, the conductive line 28b, the metal interconnection 12e and the sixth switch element T6. The directions of the magnetic moment of the first free layer 20a and the second free layer 20b are changed. In this way, the write operation of the first memory unit U1 and the second memory unit U2 can be completed. Similar to FIG. 6, the current I2 passes parallel to the magnetic moment direction of the first free layer 20a and the second free layer 20b, therefore this write operation is also an SOT write.

Figure 8:
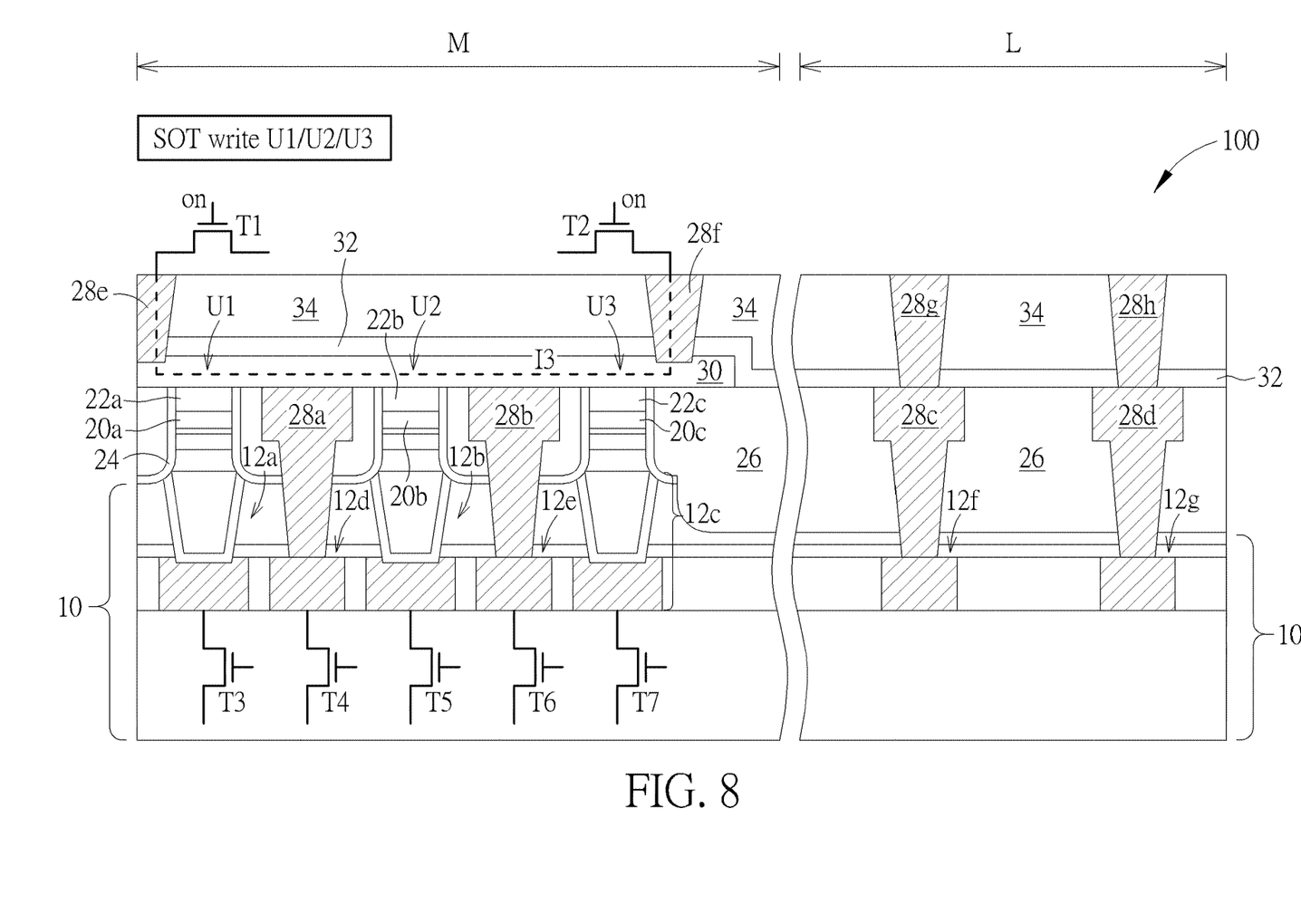
FIG. 8 depicts a write operation of an MRAM structure of the present invention.

FIG. 8 depicts a write operation of an MRAM structure of the present invention.

As shown in FIG. 8, this embodiment demonstrates a write operation performed to write the first memory unit U1, the second memory unit U2 and the third memory unit U3 simultaneously. The writing method includes simultaneously turning on the first switch element T1 and the second switch element T2. Meanwhile, the third switch element T3, the fourth switch element T4, the fifth switch element T5, the sixth switch element T6 and the seventh switch element T7 are turned off. At this point, the current I3 flows between the first switch element T1, the conductive line 28e, the SOT metal conductive line 30, the conductive line 28f, and the second switch element T2. The directions of the magnetic moment of the first free layer 20a, the second free layer 20b and the third free layer 20c are changed during the operation. In this way, the write operation of the first memory unit U1, the second memory unit U2 and the third memory unit U3 can be completed. Similar to FIG. 7, the current I3 passes parallel to the magnetic moment direction of the first free layer 20a, the second free layer 20b and the third free layer 20c, therefore this write operation is also an SOT write.

Figure 9:
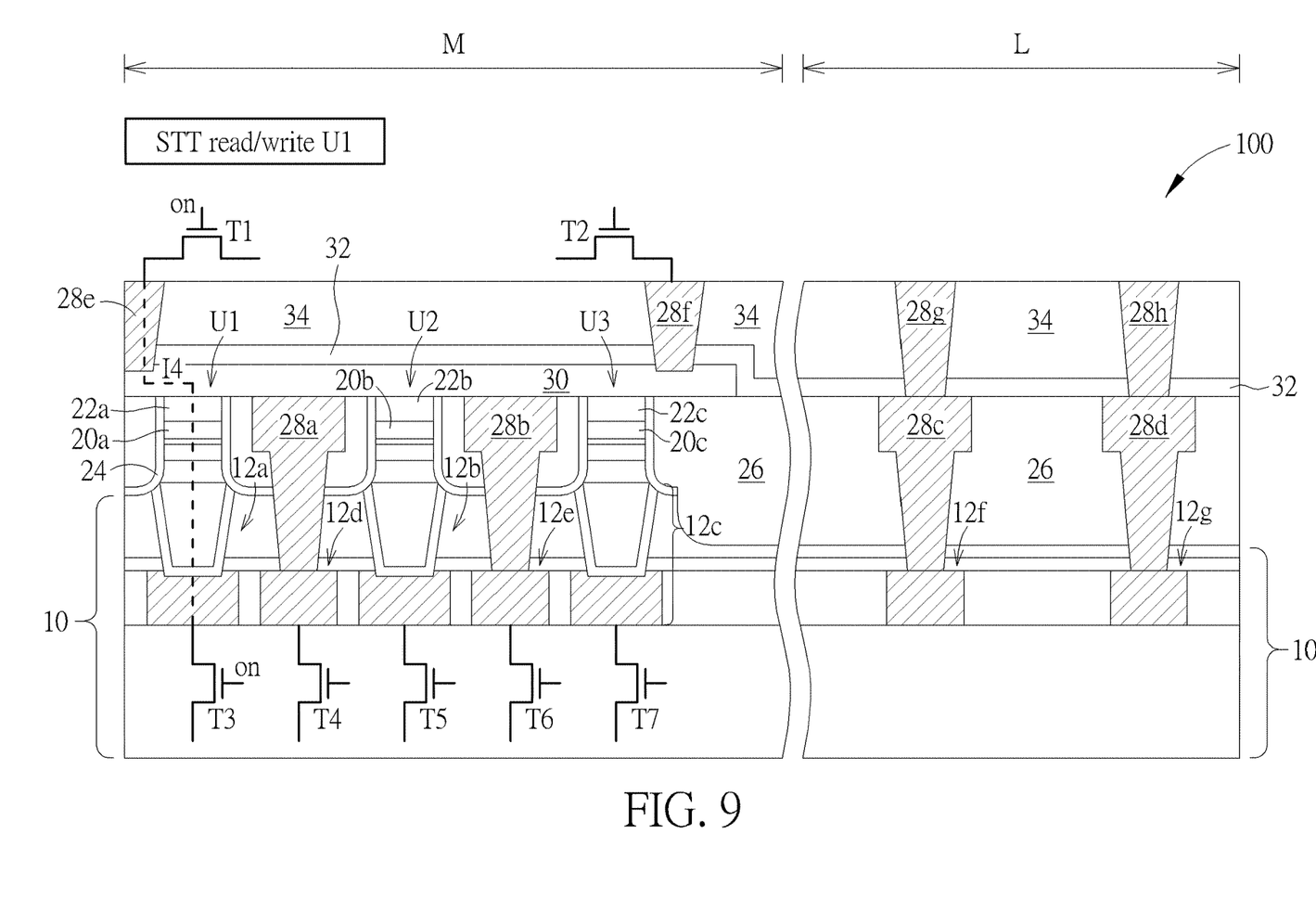
FIG. 9 depicts a read/write operation of a first memory unit of the present invention.

FIG. 9 depicts a read/write operation of a first memory unit U1 of the present invention.

As shown in FIG. 9, this embodiment demonstrates individually read or write the first memory unit U1. The read/write operations include simultaneously turning on the first switch element T1 and the third switch element T3 to read or write the first memory unit U1. Meanwhile, the second switch element T2, the fourth switch element T4, the fifth switch element T5, the sixth switch element T6 and the seventh switch element T7 are turned off. At this point, the current I4 flows between the first switch element T1, the conductive line 28e, the SOT metal conductive line 30, the first memory unit U1, the metal interconnection 12a and the third switch element T3. Since the current I4 passes the magnetic moment direction of the first free layer 20a perpendicularly, therefore, this operation is called STT (Spin-Torque Transfer) read or STT write.

Figure 10:
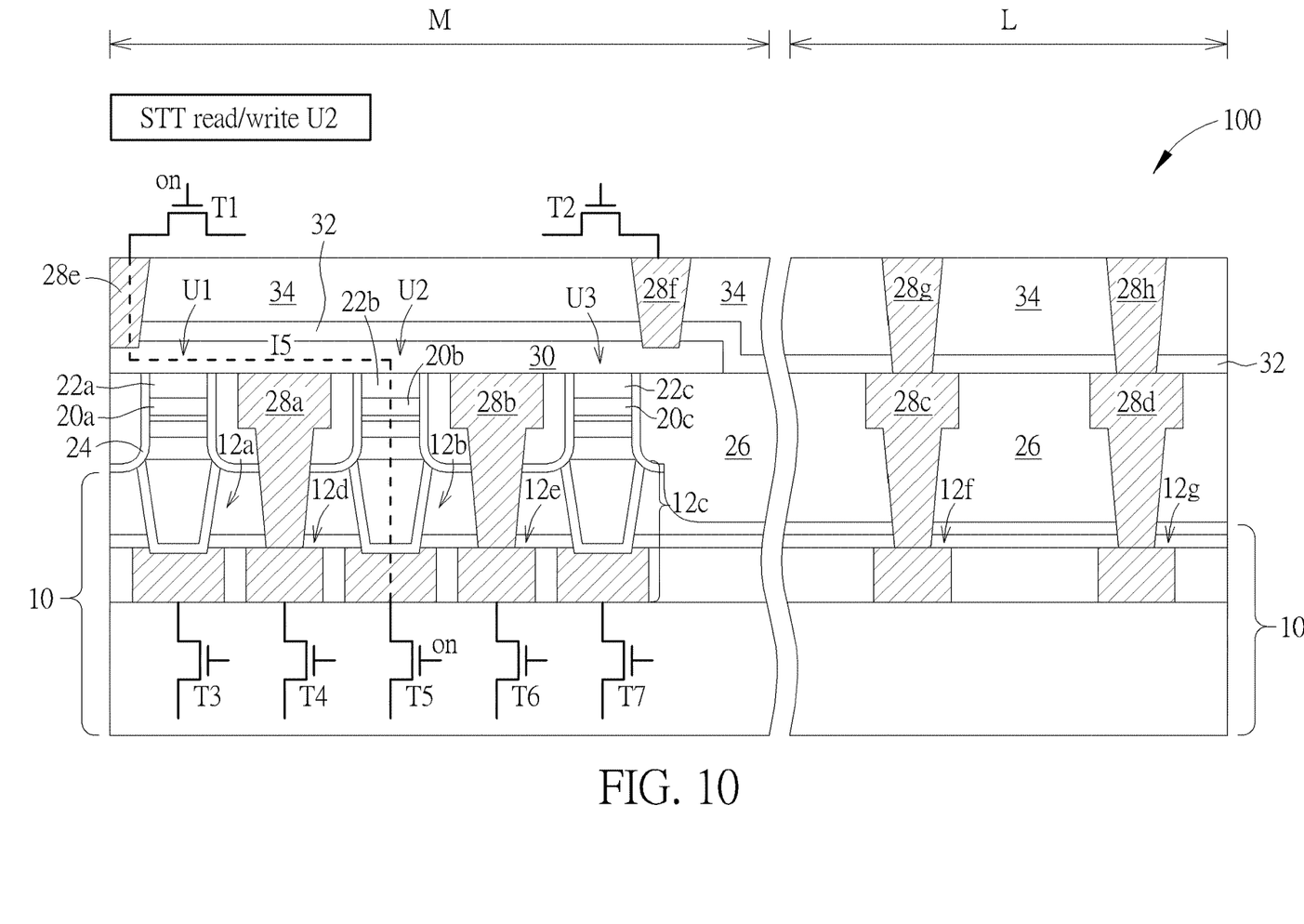
FIG. 10 depicts a read/write operation of a second memory unit of the present invention.

FIG. 10 depicts a read/write operation of a second memory unit U2 of the present invention.

As shown in FIG. 10, this embodiment demonstrates individually read or write the second memory unit U2. The read/write operations include simultaneously turning on the first switch element T1 and the fifth switch element T5 to read or write the second memory unit U2. Meanwhile, the second switch element T2, the third switch element T3, the fourth switch element T4, the sixth switch element T6 and the seventh switch element T7 are turned off. At this point, the current I5 flows between the first switch element T1, the conductive line 28e, the SOT metal conductive line 30, the second memory unit U2, the metal interconnection 12b and the fifth switch element T5. Similar to FIG. 9, the current I5 passes the magnetic moment direction of the second free layer 20b perpendicularly, therefore, this operation is called STT read or STT write.

The present invention provides conductive lines 28a/28b between memory units, so that the SOT write can be used to write only one memory unit and also be used to write numerous memory units. In this way, the memory unit can be programed in various ways.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A magnetoresistive random access memory (MRAM) structure, comprising:
    a first memory unit, wherein the first memory unit comprises a first magnetic tunnel junction (MTJ);
    a second memory unit, wherein the second memory unit comprises a second MTJ;
    a conductive line disposed between the first memory unit and the second memory unit;
    a spin orbit torque (SOT) metal conductive line disposed on the first memory unit, the conductive line and the second memory unit, wherein the SOT metal conductive line contacts and electrically connects an end of the first memory unit, an end of the conductive line and an end of the second memory unit;
    a first switch element electrically connecting to an end of the SOT metal conductive line;
    a second switch element electrically connecting to the other end of the SOT metal conductive line;
    a third switch element electrically connecting to the other end of the first memory unit;
    a fourth switch element electrically connecting to the other end of the conductive line; and
    a fifth switch element electrically connecting to the other end of the second memory unit.

2. The MRAM structure of claim 1, wherein the first MTJ comprises a first reference layer, a first barrier layer and a first free layer stacked from bottom to top, and the second MTJ comprises a second reference layer, a second barrier layer and a second free layer stacked from bottom to top.

3. The MRAM structure of claim 2, wherein the first memory unit further comprises a first SOT metal layer disposed on the first MTJ, the first SOT metal layer contacts the first MTJ, and a width of the first SOT metal layer is the same as a width of the first MTJ.

4. The MRAM structure of claim 3, wherein the first free layer contacts the first SOT metal layer.

5. The MRAM structure of claim 3, wherein the first SOT metal layer comprises ruthenium, tungsten, tantalum, iridium, platinum, hafnium, beryllium copper alloy, iridium copper alloy or gold tungsten alloy.

6. The MRAM structure of claim 2, wherein the second memory unit further comprises a second SOT metal layer disposed on the second MTJ, the second SOT metal layer contacts the second MTJ, and a width of the second SOT metal layer is the same as a width of the second MTJ.

7. The MRAM structure of claim 6, wherein the second free layer contacts the second SOT metal layer.

8. The MRAM structure of claim 6, wherein the second SOT metal layer comprises ruthenium, tungsten, tantalum, iridium, platinum, hafnium, beryllium copper alloy, iridium copper alloy or gold tungsten alloy.

9. The MRAM structure of claim 1, wherein the SOT metal conductive line comprises ruthenium, tungsten, tantalum, iridium, platinum, hafnium, beryllium copper alloy, iridium copper alloy or gold tungsten alloy.

10. The MRAM structure of claim 1, wherein a write operation of the MRAM structure is performed by using one of the following methods:
    simultaneously turning on the first switch element and the fourth switch element to write the first memory unit;
    simultaneously turning on the first switch element and the second switch element to simultaneously write the first memory unit and the second memory unit;
    simultaneously turning on the first switch element and the third switch element to write the first memory unit; and
    simultaneously turning on the first switch element and the fifth switch element to write the second memory unit.

11. The MRAM structure of claim 1, wherein a read operation of the MRAM structure is performed by using one of the following methods:
    simultaneously turning on the first switch element and the third switch element to read the first memory unit; and
    simultaneously turning on the first switch element and the fifth switch element to read the second memory unit.

12. The MRAM structure of claim 1, wherein a top surface of the first memory unit is aligned with a top surface of the SOT metal conductive line, and a top surface of the second memory unit is aligned with the top surface of the SOT metal conductive line.

* * * * *